United States Patent [19]
Hepworth et al.

[11] 3,976,949
[45] Aug. 24, 1976

[54] EDGE SENSITIVE SET-RESET FLIP FLOP

[75] Inventors: Edward C. Hepworth, Apache Junction; Rodney J. Means, Tempe, both of Ariz.

[73] Assignee: Motorola, Inc., Chicago, Ill.

[22] Filed: Jan. 13, 1975

[21] Appl. No.: 540,752

[52] U.S. Cl. ............................... 328/206; 307/205; 307/279; 307/289; 328/195
[51] Int. Cl.² .................. H03K 3/286; H03K 3/353
[58] Field of Search ............ 307/279, 289, 291, 205; 328/195, 200, 196, 206, 162, 163

[56] References Cited
UNITED STATES PATENTS

| | | | |
|---|---|---|---|
| 3,234,401 | 2/1966 | Dinman | 307/289 X |
| 3,515,901 | 6/1970 | White | 307/215 |
| 3,613,017 | 10/1971 | Howells | 328/206 X |
| 3,753,014 | 8/1973 | Kronies et al. | 328/195 X |
| 3,757,231 | 9/1973 | Faustini | 307/DIG. 1 X |

FOREIGN PATENTS OR APPLICATIONS 1,185,938  3/1970  United Kingdom ................ 328/206

OTHER PUBLICATIONS

Walker, "Design Flip-Flops from LSI Cells"; *Electronic Design* 12, 6/6/1968; pp. 82–86.

*Primary Examiner*—John S. Heyman
*Assistant Examiner*—L. N. Anagnos
*Attorney, Agent, or Firm*—Harry M. Weiss; Charles Hoffman

[57] ABSTRACT

An edge sensitive set-reset flip-flop is implemented by providing a conventional cross-coupled coincident gate flip-flop with an input means consisting of an inverter, a noninverting delay element and a coincident gate. The input means buffers binary input signals such that the cross-coupled coincident flip-flop will change state only in response to binary transitions of a prescribed direction.

6 Claims, 3 Drawing Figures

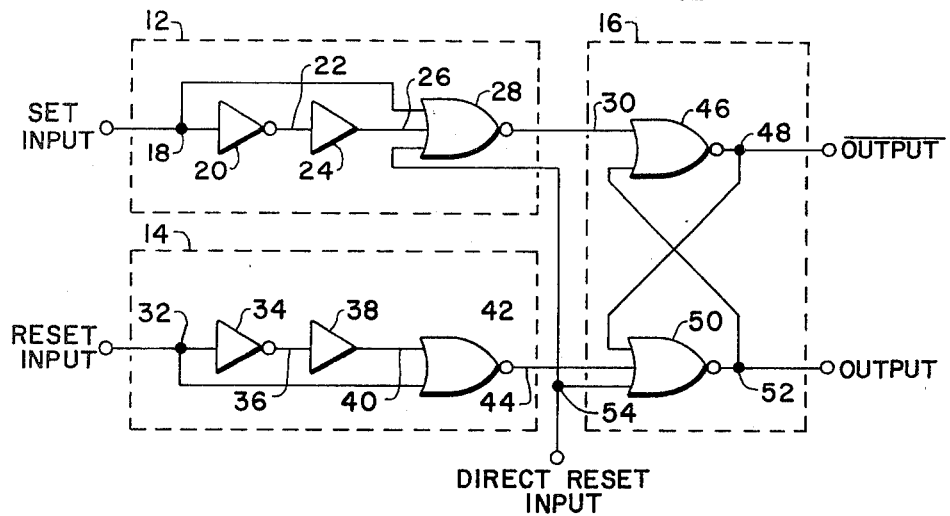
FIG. I
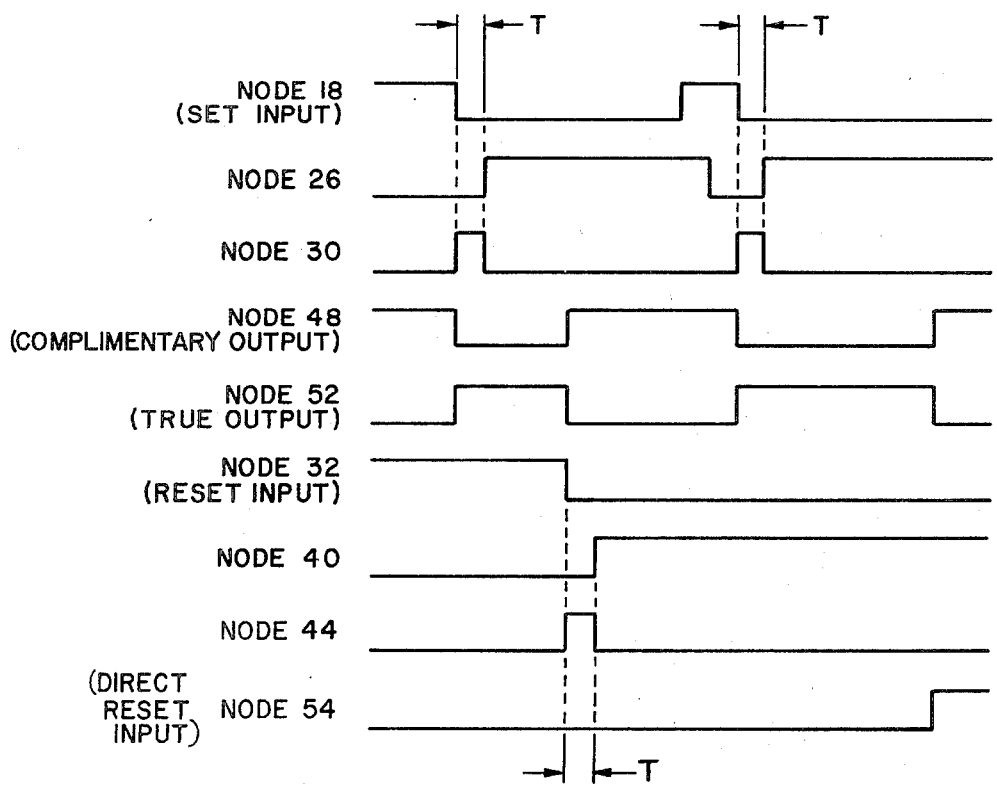
FIG. 2

EDGE SENSITIVE SET-RESET FLIP FLOP

BACKGROUND OF THE INVENTION

1. Field Of The Invention

The invention of this application relates, in general, to digital logic circuitry and, in particular to digital flip-flop circuits.

2. Description Of The Prior Art

In digital systems it is desirable to use bi-stable memory elements which change state in response to the application of a binary input signal. This type of element is called a flip-flop. A common elementary form of the flip-flop is the "set-reset" flip-flop in which an binary input signal applied to one input called the "set" input causes the flip-flop to assume the "set" state and a corresponding binary input signal applied to the "reset" input causes the flip-flop to assume the "reset" state.

Set-reset flip-flops are useful in many of the components of digital systems. They form the basic building blocks for more complex combinatorial and sequential logic circuits such as counters, multiplexers, memories, shift registers, and others.

Prior art logic circuitry shows the set-reset flip-flop in an elementary form as a pair of coincidence gates cross-coupled so that the logic level at the output of one gate feeds back to an input of the other gate to latch the flip-flop in a stable state. Application of the appropriate input logic signal causes a change at a gate output and the cross-coupling of the output back to the input of the other gate will cause the flip-flop to assume its other stable state. Thus the flip-flop can be "set" and "reset". The elementary form of the set-reset flip-flop can consist of cross-coupled NOR gates or cross-coupled NAND gates. The choice of configuration depends upon whether logic "1" or logic "0" is the active level of the input exitation to the flip-flop.

When the basic set-reset flip-flop is used as a building block in more complex logic circuit and system applications, a variety of more complex forms emerge as is shown in the prior art. These forms include toggle flip-flops, delay flip-flops, JK flip-flops, master-slave flip-flops, and other forms, each of which have special logical characteristics.

A problem frequently encountered in the application of flip-flops in logic design is the requirement that a flip-flop memory element change state in response to a logical transition or "edge" applied to its input. This requirement can be to detect when an input signal traverses from the logic "1" state to the logic "0" state or when the input signal traverses from the logic "0" state to the logic "1" state. It is possible to solve this problem through the use of multi-level flip-flop circuit arrangements such as with two delay flip-flops or with master-slave flip-flop configurations. These solutions require large number of logic elements and, in IC applications, use up a large portion of the total area of the IC chip tending to reduce the IC fabrication yield and increase cost. Thus a simple solution to the logic design requirement of a "edge sensitive" set-reset flip-flop is highly desirable.

SUMMARY OF THE INVENTION

Accordingly, it is the object of this invention to provide an improved edge sensitive set-reset flip-flop circuit.

It is an additional object of this invention to provide an improved edge sense set-reset flip-flop circuit which can be implemented with a simple configuration of coincident gates, inverters and non-inverting delay elements.

It is a further object of this invention to provide an improved edge sensitive set-reset flip-flop which can be readily adapted to provide level sensitive inputs.

It is a further object of this invention to provide an improved edge sensitive flip-flop which is readily implemented in integrated circuit form.

It is a further object of this invention to provide an improved edge sensitive set-reset flip-flop which can be implemented in integrated circuit form using MOSFET technology.

It is a further object of this invention to provide an improved edge sensitive set-reset flip-flop whose simple configuration requires minimum chip area when implemented in integrated circuit form thus being more economical to manufacture.

In accordance with the aforementioned objects, the present invention provides an edge-sensitive set-reset flip-flop implemented by providing a cross-coupled coincident gate flip-flop with an input circuit which buffers binary input signals such that the cross-coupled coincident gate flip-flop will change state only in response to binary input transitions of a prescribed direction. The input circuit includes a coincident gate and a delay element interconnected such that input transitions of a prescribed direction result in an output pulse which is then coupled to the coincident gate flip-flop.

BRIEF DESCRIPTION OF THE DRAWINGS

FIG. 1 is a logic diagram of the edge sensitive set-reset flip-flop.

FIG. 2 is a timing diagram showing the operation of the edge sensitive set-reset flip-flop.

DETAILED DESCRIPTION OF THE INVENTION

Figure 3:
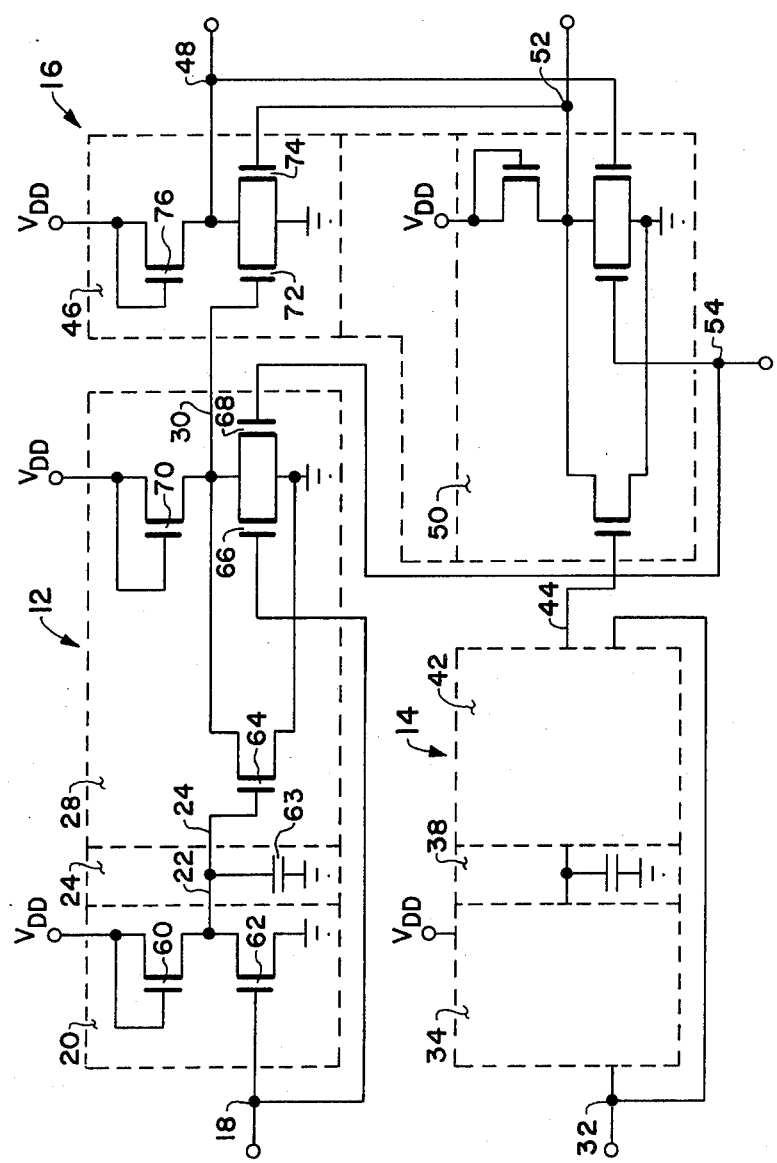
FIG. 3 is a schematic diagram of the edge sensitive set-reset flip-flop circuit.

The edge sensitive set-reset flip-flop of this application is a digital logic circuit made up of digital logic building blocks including "gates". The logic gates used in this application are of a widely used type which can be catagorized in general as "coincidence" gates. The term coincidence gate is descriptive of the functioning of this type gate in that the coincidence of the appropriate type binary signals at the gate inputs results in a predetermined type binary signal at the gate output. Coincidence gates can be implemented in a variety of forms in accordance with the function desired and the widely known NAND gate, NOR gate, AND gate, and OR gate are examples of different types of coincident gates. The particular embodiment of the edge sensitive set-reset flip-flop described in this application makes use of NOR gates. In a NOR gate, any logic "1" signal will be produced at the gate output if and only if, there is a coincidence of logic "0" signals at the gate inputs.

FIG. 1 shows a logic diagram illustrating one embodiment of the edge sensitive set-reset flip-flop circuit 10. The circuit consists of a first input circuit means 12 and a second input circuit means 14 each of which are coupled to the inputs of a conventionl set-reset flip-flop 16. The first input circuit means 12 consists of an input conductor 18 which couples to the input of inverter 20 and also couples to one input of NOR gates 28. The output of inverter 20 couples to non-inverting delay element 24 via conductor 22. The output of delay element 24 couples to another input of NOR gate 28 via conductor 26. A third input of NOR gate 28 couples to the direct reset conductor 54 which also couples to an input of the set-reset flip-flop 16. The output of NOR gate 28 couples to an input of set-reset flip-flop 16 via conductor 30. The structure of the second input circuit means 14 is similar to that of the first input circuit means 12. Input conductor 32 couples to one input of NOR gate 42 via inverter 34 and non-inverting delay element 38 and also couples directly to a second input of NOR gate 42. The output of NOR gate 42 couples to an input of set-reset flip-flop 16 via conductor 44. Set-reset flip-flop 16 consists of NOR gate 46 and NOR gate 50. One input of NOR gate 46 couples to the first input circuit means via conductor 30 and a second input couples to the output of NOR gate 50 via conductor 52. The output of NOR gate 46 couples to conductor 48 which is the complementary output of the edge sensitive set-reset flip-flop circuit. NOR gate 50 has one input which couples to the second input circuit means via conductor 44, a second input which couples to the output of NOR gate 46 via conductor 48 and a third input which couples to the direct reset conductor 54. The output of NOR gate 50 couples to conductor 52 which is the true output of the edge sensitive set-reset flip-flop 10.

FIG. 3 shows the edge sensitive set-reset flip-flop circuit 10 of FIG. 1 in a schematic diagram form in which the logic elements are implemented using MOSFET devices. (It should be noted that in the art the acronym MOSFET is widely understood to include within the scope of its meaning all insulated gate and field effect transistors, and this is the intended meaning in the description herein of this invention. It should be recognized by those skilled in the art that a MOSFET may be of the P-channel type or the N-channel type. For the description of the operation of circuits presented herein, it is assumed that N-channel MOSFETs are used. However, P-channel MOSFETs may also be used. It is also well known that a MOSFET is a bilateral device having two main electrodes which may interchangeably function as source or drain electrodes, depending on which is at the more positive voltage. The convention adopted for the description herein is that the main electrodes will be identified as either a source or a drain, although it is understood that during circuit operation an electrode identified as the source may function as a drain part of the time).

FIG. 3 shows one possible arrangement of MOSFET devices embodying the logic diagram of FIG. 1. In FIG. 3, a representative inverter 20 consists of an input conductor 18 coupled to the gate of a switching MOSFET 62 whose drain is connected to the source of a load MOSFET 60. The drain of load MOSFET 60 is connected to its own gate for self-bias. The drain of switching MOSFET 62 also connects to conductor 22 which is the output of the inverter 20 in the particular embodiment of FIG. 3. The non-inverting delay element 24 of FIG. 1 is implemented by using a single capacitor 63 which has one terminal connected to ground and another terminal connected to the common node of the delay element input conductor 22 and output conductor 24. FIG. 3 also shows representative three input NOR gate 28 which has input conductor 24 coupled to the gate of switching MOSFET 64, input conductor 18 coupled to the gate of switching MOSFET 66 and input conductor 54 coupled to the gate of switching MOSFET 68. The source electrodes of MOSFETs 64, 66 and 68 each connect to ground and the drain electrodes of MOSFETs 64, 66 and 68 each connect to conductor 30 which is the output conductor of NOR gate 28. Conductor 30 also connects to the source electrode of load MOSFET 70. The drain electrode of MOSFET 70 connects to its own gate for self-bias and to the $V_{DD}$ power supply. FIG. 3 also shows a representative two input NOR gate 46 which has input conductor 30 coupled to the gate of switching MOSFET 72 and input conductor 52 coupled to the gate of switching MOSFET 74. The source electrodes of switching MOSFETs 72 and 74 each connect to ground and the drain electrodes of switching MOSFETs 72 and 74 each connect to conductor 48 which is the output conductor of NOR gate 46. Conductor 48 also connects to the source of load MOSFET 76 whose drain electrode connects to its own gate for self-bias and to the $V_{DD}$ power supply. Inverter 34, delay element 38, two input NOR gate 42 and three input NOR gate 50 shown in block diagram form in FIG. 3, each have the appropriate structure as recited above.

The operation of the edge sensitive set-reset flip-flop 10 is such that the first input circuit means 12 and the second input circuit means 14 function to allow the conventional set-reset flip-flop 16 to be set or reset only in response to a negative going transition on the set input 18 or the reset input 32 respectively. Operation is illustrated by the timing diagram of FIG. 2 which shows the electrical waveforms present at the various circuit nodes during an operational sequence. The operation of the first input circuit means is explained by noting the input conditions of NOR gate 28. In the steady state, the output of NOR gate 28 must always be at logic "0" because the logic inversion performed by inverter 20 guarantees that at least one input of NOR gate 28 will be at logic "1". The output of NOR gate 28 can go to logic "1" on an instantaneous basis because of the action of non-inverting delay element 24. Referring to FIG. 1, and assuming the direct reset input 54 is at logic "0", a transition from logic "1" to logic "0" at the set input 18 initially results in logic "0" on all three inputs of NOR gate 28 because the logic "1" at the output of inverter 20 requires a delay time T to propagate through non-inverting delay element 24 before it can effect the input condition of NOR gate 28. Thus as shown in FIG. 2, the transition from logic "1" to logic "0" at the set input 18 results in a logic "1" level pulse of time duration T at the output of NOR gate 28 while a transition from logic "0" to logic "1" at the set input 18 has no effect on the output of NOR gate 28. The first input circuit means 12 is thus "edge sensitive", responding with an output pulse only to input transitions from logic "1" to logic "0". The operation of the second input circuit means 14 is identical so that logic "1" pulse is produced at the output of NOR gate 42 only in response to a transition from logic "1" to logic "0" on the reset input 32.

The operation of set-reset flip-flop 16, which is a conventional cross-coupled NOR gate flip-flop is straight-forward. Assuming the flip-flop is initially in the reset state, a transition from logic "0" to logic "1" on conductor 30 from the first input circuit means couples to an input to NOR gate 46 forcing the output of NOR gate 46 to logic "0". The resulting logic "0" on conductor 48 couples to an input of NOR gate 50 whose other inputs are also at logic "0" resulting in logic "1" on conductor 52 which couples back to another input of NOR gate 46 and thus latches the flip-flop in the set state with conductor 48 (the complementary output) at logic "0" and conductor 52 (the true output) at logic "1". The set-reset flip-flop 16 is "reset" in a similar manner in response to a transition from logic "0" to logic "1" on conductor 44 from the second input circuit means.

The preferred embodiment of the edge sensitive set-reset flip-flop of FIG. 1 also shows an additional "direct reset" input 54. This input is a level sensitive input which allows the edge sensitive set-reset flip-flop to be directly reset independent of signal conditions on the edge-sensitive inputs 18 and 32. A logic "1" on the reset direct input 54 couples to an input of NOR gate 50 to force the set-reset flip-flop 16 to the reset state as described above. In addition the reset direct input 54 couples to an input of NOR gate 28 forcing the output of NOR gate to a logical "0" to block any interaction with the direct reset function. This additional coupling to NOR gate 28 insures that the complementary output 48 will be at logical "1" independent of signal conditions on the set input 18.

While this invention has been shown in connection with a specific logic circuit embodiment, it should be apparent to persons skilled in the art that various changes in form and arrangement of parts may be made to suit various requirements without departing from the spirit and scope of the present invention.

What is claimed is:
1. A digital circuit comprising:
 a. a first input terminal;
 b. memory means having a first memory input for storing a digital representation of a predetermined input signal transition on said first input terminal;
 c. a first coincident gate having an output coupled to said first memory input and having a first and a second gate input;
 d. a first non-inverting delay element having an output coupled to said first gate input and having a first delay input;
 e. an inverting element having an output coupled to said delay input and having an input coupled to said first input terminal and also coupled to said second gate input.

2. A digital system as recited in claim 1 further comprising:
 a. a second input terminal;
 b. a second memory input for storing a digital representation of a predetermined input signal transition on said second input terminal within said memory means;
 c. a second coincident gate having an output coupled to said second memory input and having a third and a fourth gate input;
 d. a second non-inverting delay element having an output coupled to said third gate input and having a second delay input;
 e. a second inverting element having an output coupled to said second delay input and having an input coupled to said second input terminal and also coupled to said fourth gate input.

3. The digital circuit recited in claim 1 wherein:
 a. said memory means is a flip-flop circuit.

4. The digital circuit recited in claim 3 further comprising:
 a. level sensitive direct reset means coupled to said flip-flop and also coupled to said first coincident gate.

5. The digital circuit recited in claim 4 wherein:
 a. said coincident gates are NOR gates.

6. The digital circuit recited in claim 5 wherein said NOR gate includes:
 a. a load MOSFET,
 b. an output terminal coupled to said load MOSFET,
 c. a switching MOSFET coupled to said load MOSFET, and
 d. an input terminal coupled to said switching MOSFET.

* * * * *